(12) United States Patent
Kawamura

(10) Patent No.: US 7,187,419 B2
(45) Date of Patent: Mar. 6, 2007

(54) TELEVISION TUNER IN WHICH LOCAL OSCILLATION SIGNAL IS PREVENTED FROM GOING OUT OF LOCK IN VIDEO DETECTION

(75) Inventor: Akira Kawamura, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 429 days.

(21) Appl. No.: 10/882,324

(22) Filed: Jun. 30, 2004

(65) Prior Publication Data
US 2005/0007499 A1      Jan. 13, 2005

(30) Foreign Application Priority Data
Jul. 7, 2003     (JP) ................ 2003-004010 U

(51) Int. Cl.
*H04N 5/50* (2006.01)
*H04N 5/44* (2006.01)

(52) U.S. Cl. ............... 348/731; 348/725; 455/265

(58) Field of Classification Search ........... 348/731, 348/732, 733, 725, 507, 544; 455/255, 264, 455/265; 331/108, 55
See application file for complete search history.

(56) References Cited

U.S. PATENT DOCUMENTS

| | | | | |
|---|---|---|---|---|
| 5,270,824 A * | 12/1993 | Dobrovolny | ................ | 348/731 |
| 6,252,633 B1 * | 6/2001 | Ruitenburg | ................ | 348/725 |
| 6,469,750 B1 * | 10/2002 | Fujita et al. | ................ | 348/731 |
| 6,639,630 B2 * | 10/2003 | Osada et al. | ................ | 348/371 |
| 6,678,013 B2 * | 1/2004 | Ogasawara | ................ | 348/731 |
| 6,757,028 B2 * | 6/2004 | Yamamoto | ................ | 348/731 |
| 6,822,697 B1 * | 11/2004 | Osada | ................ | 348/731 |
| 6,842,198 B2 * | 1/2005 | Suzuki et al. | ................ | 348/731 |
| 6,876,402 B2 * | 4/2005 | Sasaki | ................ | 348/731 |
| 7,006,160 B2 * | 2/2006 | Kudo | ................ | 348/723 |
| 2002/0154249 A1 * | 10/2002 | Kawamura | ................ | 348/731 |
| 2003/0112377 A1 * | 6/2003 | Kawamura et al. | ......... | 348/731 |

FOREIGN PATENT DOCUMENTS

JP      2003-169265      6/2003

* cited by examiner

*Primary Examiner*—David Ometz
*Assistant Examiner*—Jean W. Désir
(74) *Attorney, Agent, or Firm*—Brinks Hofer Gilson & Lione

(57) ABSTRACT

A television tuner includes a surface acoustic wave filter that receives input of an intermediate-frequency signal; an integrated circuit for detecting the intermediate-frequency signal, the integrated circuit including a video detector and a voltage-controlled oscillator that supplies a local oscillation signal for synchronous detection to the video detector; and a tank circuit that is provided externally to the integrated circuit and that is connected to the voltage-controlled oscillator. The integrated circuit has balanced input terminals associated with a first edge, and two connecting terminals associated with a second edge opposite to the first edge. The balanced input terminals are connected to output terminals of the surface acoustic wave filter, and the connecting terminals are connected to the tank circuit. Both ends of the tank circuit are connected to the connecting terminals via two connecting lines, the connecting lines crossing each other only once between the connecting terminals and the tank circuit.

3 Claims, 1 Drawing Sheet

TELEVISION TUNER IN WHICH LOCAL OSCILLATION SIGNAL IS PREVENTED FROM GOING OUT OF LOCK IN VIDEO DETECTION

This application claims the benefit of priority to Japanese Patent Application No. 2003-004010, herein incorporated by reference.

BACKGROUND OF THE INVENTION

1. Field of the Invention

The present invention relates to television tuners. More specifically, the present invention relates to a television tuner in which a local oscillation signal is prevented from going out of lock in video detection.

2. Description of the Related Art

FIG. 2 shows the configuration of a conventional television tuner. Referring to FIG. 2, a television signal is converted into an intermediate-frequency (IF) signal by a frequency converter (not shown), and the IF signal is input to a surface acoustic wave (SAW) filter 31. The SAW filter 31 has an unbalanced input and a balanced output. The IF signal having passed through the SAW filter 31 is input to an integrated circuit 32 for video detection. The integrated circuit 32 includes a video detector 32a and a voltage-controlled oscillator 32b. The integrated circuit 32 has a plurality of terminals along opposite edges thereof. An IF signal input to balanced input terminals T1 and T2 of the integrated circuit 32 is supplied to the video detector 32a via an amplifier and other internal circuitry (not shown).

The voltage-controlled oscillator 32b is used to supply a local oscillation signal for synchronous detection to the video detector 32a. The voltage-controlled oscillator 32b is connected to a tank circuit 33 provided externally to the integrated circuit 32, via the connecting terminals T3 and T4. Thus, the connecting terminals T3 and T4 are connected to the tank circuit 33 via parallel connecting lines 34 and 35. The SAW filter 31, the integrated circuit 32, and the tank circuit 33 are disposed on a circuit board (not shown), so that the connecting lines 34 and 35 are implemented by conductor patterns formed on the circuit board. The voltage-controlled oscillator 32b, connected to the tank circuit 33, oscillates at a frequency that is controlled by an automatic phase control (APC) circuit (not shown) provided in the integrated circuit 32 so that the oscillation frequency will be locked to a video carrier frequency of IF signals. A video signal and an audio signal detected are output from terminals T5 and T6, respectively.

When the voltage-controlled oscillator 32b oscillates, the connecting lines 34 and 35 connecting the tank circuit 33 with the voltage-controlled oscillator 32b generate electromagnetic fields. The electromagnetic fields involve radio waves having frequencies corresponding to IF signals, so that the radio waves readily enter the input terminals T1 and T2. Therefore, the APC circuit in the integrated circuit 32 fails to control the voltage-controlled oscillator 32b appropriately, particularly when the intensity of an electromagnetic field received is low. This causes the voltage-controlled oscillator 32b to go out of lock, and results in incorrect operation of the video detector 32a.

SUMMARY OF THE INVENTION

Accordingly, it is an object of the present invention to prevent a voltage-controlled oscillator from going out of lock and to thereby prevent incorrect operation in video detection.

To this end, the present invention provides a television tuner including a surface acoustic wave filter that receives input of an intermediate-frequency signal; an integrated circuit for detecting the intermediate-frequency signal, the integrated circuit including at least a video detector and a voltage-controlled oscillator that supplies a local oscillation signal for synchronous detection to the video detector; and a tank circuit that is provided externally to the integrated circuit for detection and that is connected to the voltage-controlled oscillator; wherein the integrated circuit has balanced input terminals associated with a first edge, the balanced input terminals being connected to output terminals of the surface acoustic wave filter, and has two connecting terminals associated with a second edge opposite to the first edge, the two connecting terminals being connected to the tank circuit, and wherein both ends of the tank circuit are connected to the connecting terminals via two connecting lines, the connecting lines crossing each other only once between the connecting terminals and the tank circuit. Therefore, when viewed from the input terminals, the electromagnetic fields before and after the crossing point are cancelled with each other, so that radio waves are substantially inhibited from being emitted by the connecting lines and entering the integrated circuit. Accordingly, even if the intensity of an electric field received decreases, the video detector operates correctly.

Preferably, in the television tuner, the surface acoustic wave filter and the tank circuit are disposed on a circuit board with the integrated circuit disposed between the surface acoustic wave filter and the tank circuit. Accordingly, radio waves are further inhibited from entering the integrated circuit.

More preferably, the connecting lines cross each other at a point having substantially the same distances from the connecting terminals and the tank circuit. Accordingly, the phase canceling of the electromagnetic fields becomes more effective.

DESCRIPTION OF THE PREFERRED EMBODIMENTS

Figure 1:
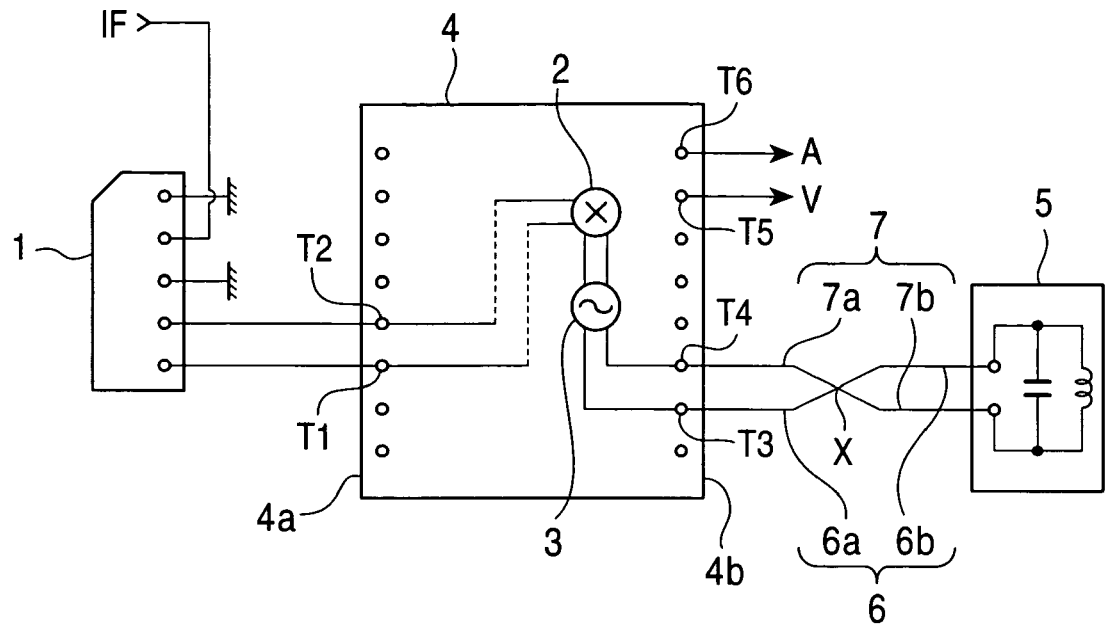
FIG. 1 is a diagram showing the configuration of a television tuner according to an embodiment of the present invention.
Figure 2:
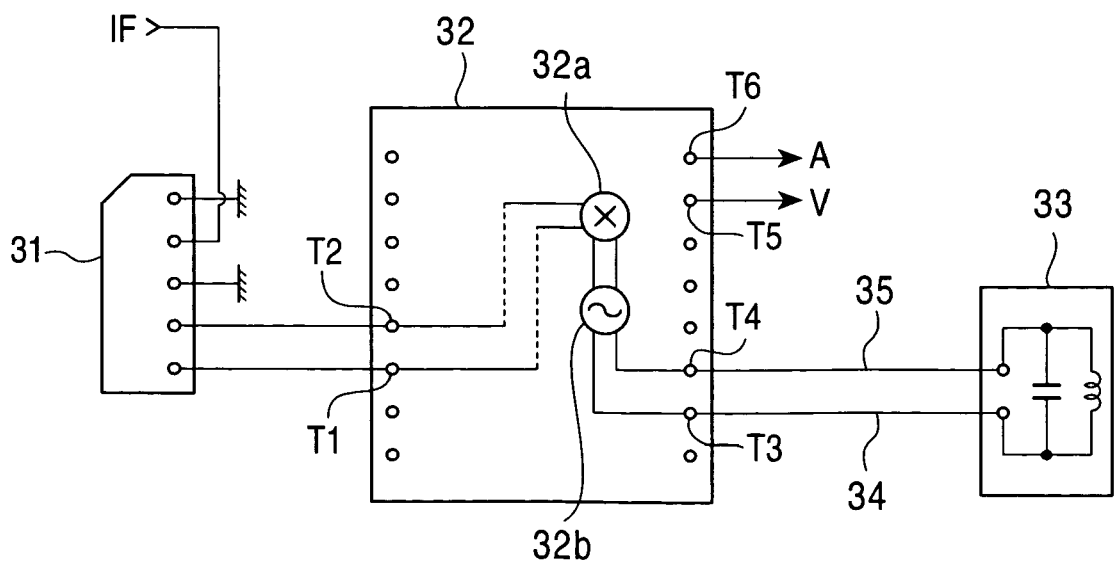
FIG. 2 is a diagram showing the configuration of a conventional television tuner.

FIG. 1 shows the configuration of a television tuner according to an embodiment of the present invention. Referring to FIG. 1, a television signal is converted into an intermediate-frequency (IF) signal by a frequency converter that is not shown, and the IF signal is input to a surface acoustic wave (SAW) filter 1. The SAW filter 1 has an unbalanced input and a balanced output. The IF signal having passed through the SAW filter 1 is input to an integrated circuit 4 for video detection. The integrated circuit 4 includes a video detector 2 and a voltage-controlled-oscillator 3. The integrated circuit 4 has a plurality of terminals along a first edge 4a and a second edge 4b opposite to each other. An IF signal input to balanced input terminals T1 and T2 associated with the first edge 4a is supplied to the video detector 2 via an amplifier and other internal circuitry (not shown).

The voltage-controlled oscillator 3 is used to supply a local oscillation signal for synchronous detection. The voltage-controlled oscillator 3 is connected to a tank circuit 5 provided externally to the integrated circuit 4, via connecting terminals T3 and T4 associated with the second edge 4*b*. Thus, the connecting terminals T3 and T4 are connected to the tank circuit 5 via parallel connecting lines 6 and 7. Since the SAW filter 1, the integrated circuit 4, and the tank circuit 5 are disposed on a circuit board (not shown), the connecting lines 6 and 7 are implemented by conductor patterns formed on the circuit board. The connecting lines 6 and 7 cross each other at a point X that has substantially the same distances from the connecting terminals T3 and T4 and the tank circuit 5.

The voltage-controlled oscillator 3, connected to the tank circuit 5, oscillates at a frequency that is controlled by an automatic phase control (APC) circuit (not shown) provided in the integrated circuit 4 so that the oscillation frequency will be locked to a video carrier frequency of IF signals. A video signal V and an audio signal A detected are output from terminals T5 and T6, respectively.

In the configuration described above, the connecting lines 6 and 7 cross each other at the point X, so that the phases of electromagnetic fields caused by connecting lines 6*a* and 7*a* between the connecting terminals T3 and T4 and the point X are opposite to the phases of electromagnetic fields caused by connecting lines 6*b* and 7*b* between the point X and the tank circuit 5. Therefore, when viewed from the input terminals T1 and T2, the electromagnetic fields before and after the point X are cancelled with each other, so that radio waves are substantially inhibited from being emitted from the connecting lines 6 and 7 and entering the integrated circuit 4.

Accordingly, incorrect operation of the voltage-controlled oscillator 3 controlled by the APC circuit in the integrated circuit 4 is prevented. Thus, the oscillation frequency of the voltage-controlled oscillator 3 is reliably locked to a video carrier wave of IF signals.

What is claimed is:

1. A television tuner comprising:

a surface acoustic wave filter that receives input of an intermediate-frequency signal;

an integrated circuit for detecting the intermediate-frequency signal, the integrated circuit comprising at least a video detector and a voltage-controlled oscillator that supplies a local oscillation signal for synchronous detection to the video detector; and a tank circuit that is provided externally to the integrated circuit for detection and that is connected to the voltage-controlled oscillator;

wherein the integrated circuit has balanced input terminals associated with a first edge, the balanced input terminals being connected to output terminals of the surface acoustic wave filter, and has two connecting terminals associated with a second edge opposite to the first edge, the two connecting terminals being connected to the tank circuit, and wherein both ends of the tank circuit are connected to the connecting terminals via two connecting lines, the connecting lines crossing each other only once between the connecting terminals and the tank circuit.

2. A television tuner according to claim 1, wherein the surface acoustic wave filter and the tank circuit are disposed on a circuit board with the integrated circuit disposed between the surface acoustic wave filter and the tank circuit.

3. A television tuner according to claim 2, wherein the connecting lines cross each other at a point having substantially the same distances from the connecting terminals and the tank circuit.

* * * * *